United States Patent [19]
Abugharbieh et al.

[11] Patent Number: 6,147,908
[45] Date of Patent: Nov. 14, 2000

[54] STABLE ADJUSTABLE PROGRAMMING VOLTAGE SCHEME

[75] Inventors: Khaldoon Abugharbieh, Sunnyvale; Donald Y. Yu, Fremont; Roger J. Bettman, Los Altos, all of Calif.

[73] Assignee: Cypress Semiconductor Corp., San Jose, Calif.

[21] Appl. No.: 08/962,860

[22] Filed: Nov. 3, 1997

[51] Int. Cl.[7] .................................................. G11C 16/06
[52] U.S. Cl. .............................. 365/185.2; 365/185.25; 365/185.28
[58] Field of Search ........................... 365/185.2, 185.25, 365/185.28, 185.33

[56] References Cited

U.S. PATENT DOCUMENTS

| | | | |
|---|---|---|---|
| 4,723,108 | 2/1988 | Murphy et al. | 323/315 |
| 5,061,862 | 10/1991 | Tamagawa | 307/296.1 |
| 5,402,370 | 3/1995 | Fazio et al. | 365/185 |
| 5,444,656 | 8/1995 | Bauer et al. | 365/185.2 |
| 5,444,659 | 8/1995 | Yokokura | 365/185.2 |
| 5,497,119 | 3/1996 | Tedrow et al. | 327/540 |
| 5,546,042 | 8/1996 | Tedrow et al. | 327/538 |
| 5,568,425 | 10/1996 | Song | 365/185.33 |
| 5,576,990 | 11/1996 | Camerlenghi et al. | 365/185.2 |
| 5,629,611 | 5/1997 | McIntyre | 323/313 |
| 5,712,815 | 1/1998 | Bill et al. | 365/185.25 X |

OTHER PUBLICATIONS

Paul R. Gray, et al., University of California, Berkeley, "Analysis and Design of Analog Integrated Circuits, Second Edition", 1984, pp. 295–296 & 515–517.

*Primary Examiner*—Huan Hoang
*Attorney, Agent, or Firm*—Blakely Sokoloff Taylor & Zafman LLP

[57] ABSTRACT

A nonvolatile memory circuit that includes a load circuit coupled to a band-gap reference circuit and a nonvolatile memory cell. The load line circuit is configured to provide a programming voltage to the nonvolatile memory cell. The programming voltage may be generated in response to the reference voltage generated by the band-gap reference circuit. The nonvolatile memory circuit may also include an amplifying circuit that amplifies the reference voltage of the band-gap circuit, and provides the amplified reference voltage to the load circuit. The nonvolatile memory circuit may further include a voltage trim circuit that trims the amplified reference voltage and provides the trimmed amplified reference voltage to the load circuit. The reference voltage, amplified reference voltage, and the trimmed amplified reference voltage may each output a stable voltage that is independent of variations in process parameters, operating temperatures, and supply voltages of the nonvolatile memory circuit.

19 Claims, 8 Drawing Sheets

STABLE ADJUSTABLE PROGRAMMING VOLTAGE SCHEME

FIELD OF THE INVENTION

The present invention relates to nonvolatile memory circuit. More particularly, the present invention relates to providing a stable, adjustable programming voltage to a nonvolatile memory circuit.

BACKGROUND

Nonvolatile memories such as an Electrically Programmable Read Only Memory ("EPROM"), Electrically Erasable Programmable Read Only Memory ("EEPROM"), and flash EEPROM use a variety of memory cell designs. One type of nonvolatile memory cell uses an electrically isolated floating gate to trap charge. A variety of mechanisms can be used to program or trap charge on the floating gate, including hot electron injection and Fowler-Nordheim tunneling. Each program technique must provide appropriate voltages to the terminals of the nonvolatile memory cell in order to accurately program the desired amount of charge on the floating gate.

FIG. 1 shows a nonvolatile memory circuit 100 that includes a nonvolatile memory cell 118 coupled to a load line circuit 112. The nonvolatile memory cell can be programmed by applying a gate voltage VG of approximately 12 volts, a drain voltage VD of approximately 7 –9 volts, and connecting the source terminal to ground. It is important to achieve and maintain these voltage ranges during programming of nonvolatile memory cell 118.

A programming voltage VD is applied to the drain of nonvolatile memory cell 118 by load line circuit 112 in response to programming power supply voltage VPP and a load line control voltage VLL. VPP is typically 11 to 13 volts, and VLL is two threshold voltage drops less than VPP due to diode connected N-channel transistors 114 and 116. Conventionally, load line circuit 112 includes a transistor that has its gate coupled to VLL and another terminal coupled to VD such that VD is approximately one threshold drop below VLL.

When nonvolatile memory circuit 100 is subjected to changes in process parameters (transistor channel lengths, widths, etc.), changes in operating temperatures, or changes in the programming supply voltage VPP, the load line voltage VLL, and consequently the programming voltage VD, vary. If VD varies too much, nonvolatile memory cell 118 may not be programmed correctly. For example, when process parameters are skewed to a fast process for n-channel transistors 114 and 116, the threshold voltages of these diode connected transistors will drop causing VLL and VD to increase accordingly. Similarly, as the operating temperature of nonvolatile memory circuit 100 increases, the threshold voltages of transistors 114 and 116 will increase causing VLL and VD to drop accordingly. Additionally, if VPP increases during operation of nonvolatile memory circuit 100, VLL and VD will increase accordingly.

When process parameters are skewed to a slow process for n-channel transistors 114 and 116 or if the operating temperature of nonvolatile memory circuit 100 decreases, the threshold voltages of these diode connected transistors will increase causing VLL and VD to drop accordingly. Similarly, if VPP decreases during operation of nonvolatile memory circuit 100, VLL and VD will drop accordingly. If programming voltage VD increases too much, other non-selected cells coupled in parallel with nonvolatile memory cell 118 may experience charge loss from their floating gates towards their drain terminals. This may reduce their margin voltages. Thus, those programmed cells may be erroneously enabled by a smaller than anticipated gate voltage VG. Increasing VD outside the programming window of drain voltages may also cause an undesirable excess amount of charge to be trapped onto the floating gate of nonvolatile memory cell 118. This may cause reliability problems due to the higher electric field placed across the insulating layer separating the floating gate and the channel region of nonvolatile memory cell 118.

FIG. 2 shows another nonvolatile memory circuit 200 that generates a load line voltage VLL from a voltage divider or resistor divider configuration including resistors 202 and 204. VLL is generally less sensitive to process and temperature fluctuations as these variations will generally have the same impact on each of resistor 202 and 204. VLL does, however, vary will changes in the power supply programming voltage VPP such that programming voltage VD will vary with changes in VPP.

Therefore, it is desirable to provide a nonvolatile memory circuit that produces a load line voltage that does not substantially vary with changes in process parameters, operating temperatures, or changes in the power supply voltage applied to the circuit. A stable load line voltage may advantageously produce a programming voltage VD that may be maintained within a programming window in spite of changes in the operating conditions and process variations of the nonvolatile memory circuit.

SUMMARY OF THE INVENTION

One embodiment of the present invention concerns a nonvolatile memory circuit that includes a load circuit coupled to a band-gap reference circuit and a nonvolatile memory cell. The load line circuit is configured to provide a programming voltage to the nonvolatile memory cell. The programming voltage may be generated in response to the reference voltage generated by the band-gap reference circuit. The nonvolatile memory circuit may also include an amplifying circuit that amplifies the reference voltage of the band-gap circuit, and provides the amplified reference voltage to the load circuit. The nonvolatile memory circuit may further include a voltage trim circuit that trims the amplified reference voltage and provides the trimmed amplified reference voltage to the load circuit. The reference voltage, amplified reference voltage, and the trimmed amplified reference voltage may each output a stable voltage that is independent of variations in process parameters, operating temperatures, and supply voltages of the nonvolatile memory circuit.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

A stable, adjustable programming voltage scheme for a nonvolatile memory device is disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

As will be described in more detail below, one embodiment of the present invention is a nonvolatile memory circuit that includes a load circuit coupled to a band-gap reference circuit and a nonvolatile memory cell. The load line circuit may be configured to provide a programming voltage to the nonvolatile memory cell in response to a reference voltage generated by the band-gap reference circuit. The nonvolatile memory circuit may also include an amplifying circuit that amplifies the reference voltage of the band-gap circuit, and provides the amplified reference voltage to the load circuit. The nonvolatile memory circuit may further include a voltage trim circuit that trims the amplified reference voltage and provides the trimmed amplified reference voltage to the load circuit. The reference voltage, amplified reference voltage, and the trimmed amplified reference voltage may each have a stable voltage that does not substantially vary with changes in process parameters (transistor channel lengths, widths, etc.), operating temperatures, and supply voltages of the nonvolatile memory circuit.

Figure 3:
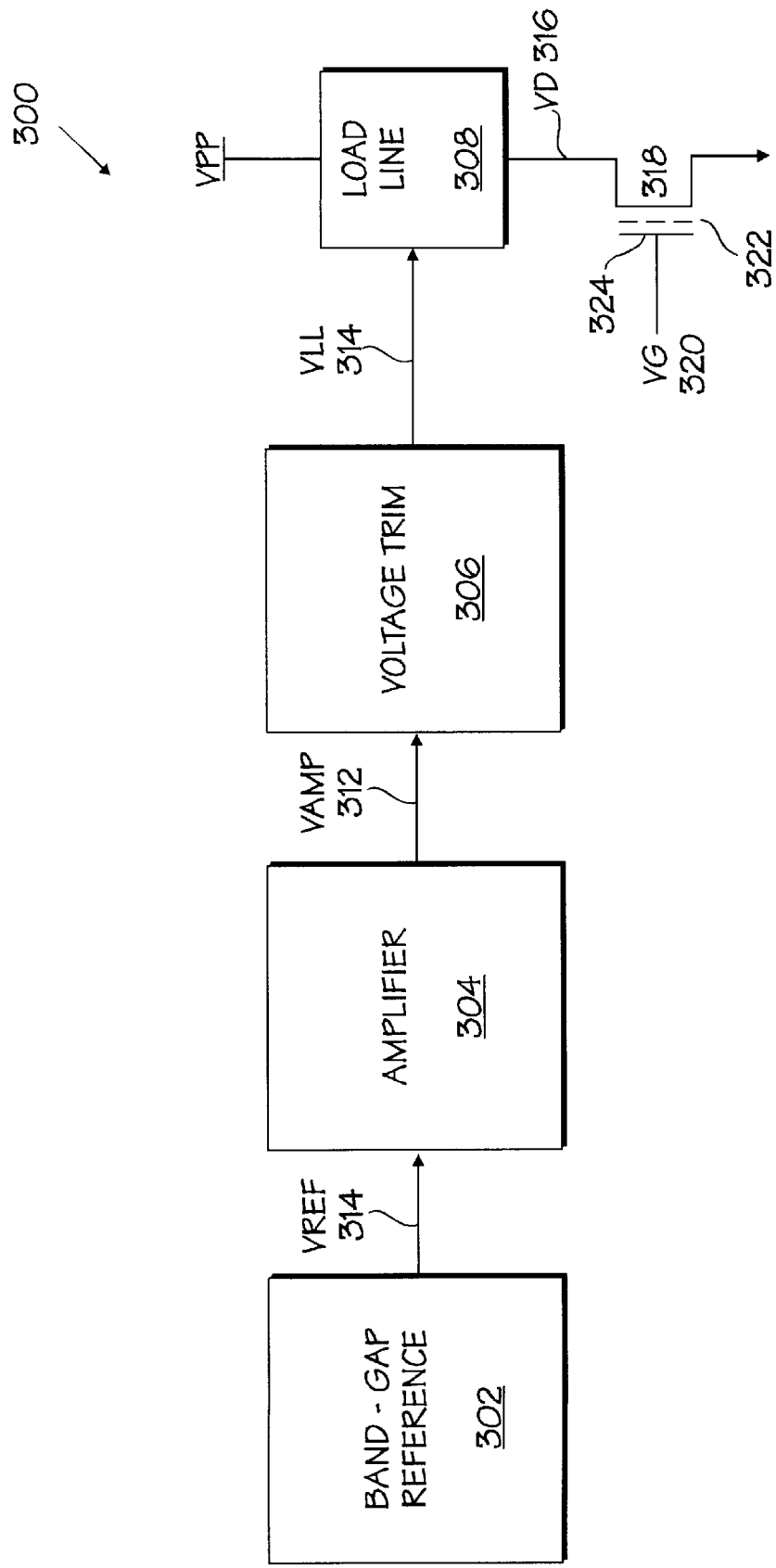
FIG. 3 is a block diagram of one embodiment of a nonvolatile memory circuit according to the present invention.

FIG. 3 shows nonvolatile memory circuit 300 that is one embodiment of the present invention. Nonvolatile memory circuit 300 may include a nonvolatile memory cell 318 coupled to a load line circuit 308. Nonvolatile memory cell 318 may be a EPROM cell, EEPROM cell, or a flash cell that stores one or more states. Nonvolatile memory cell 318 includes a drain terminal coupled to load line circuit 308, a select gate 324 coupled to a gate voltage VG 320, a floating gate 322, and a source terminal that may be coupled to a ground voltage or approximately zero volts. Floating gate 322 may be an electrically isolated floating gate that traps charge.

A variety of mechanisms can be used to program or trap charge on floating gate 322, including hot electron injection and tunneling (e.g., Fowler-Nordheim tunneling). For one embodiment, nonvolatile memory cell 318 may be programmed by applying approximately 10 volts to approximately 13 volts on VG 320 and a programming voltage VD 316 of approximately 7 volts to approximately 9 volts. For alternative embodiments, other voltages may be used. The programming voltage VD 316 may be supplied in response to the programming supply voltage VPP and the load line control voltage VLL 314. For one embodiment, the programming supply voltage VPP may be from approximately 10 volts to approximately 13 volts, and the load line control voltage VLL 314 may be from approximately 7 volts to approximately 10 volts. For other embodiments, other voltages may be used.

Load line circuit 308 may be any load line circuit that supplies the requisite programming voltage VD 316 and sufficient current to allow nonvolatile memory cell 318 to be programmed to a desired state. For example, load line circuit 308 may be a resistor, a diode, and/or a transistor. For one embodiment, load line circuit 308 includes a transistor that has its gate coupled to VLL 314, its drain coupled to VPP, and its source coupled to the drain of nonvolatile memory cell 318. For this embodiment, the programming voltage VD 316 may be approximately one threshold drop below VLL 314.

As the programming voltage VD 316 is dependent upon the load line control voltage VLL 314, is it desirable for VLL 314 to be a stable voltage that does not substantially vary with changes in operating conditions of nonvolatile memory circuit 300 including changes in process parameters (transistor channel lengths, widths, etc.) of the active and passive circuit elements, operating temperatures, and supply voltages of the nonvolatile memory circuit. When VLL 314 is stable, VD 316 may also be stable or independent of changes in the operation conditions of nonvolatile memory circuit 300.

A stable load line control voltage VLL 314 and, consequently, a stable VD 316 may be generated from band-gap reference circuit 302, non-inverting operation amplifier 304, and from voltage trim circuit 306. Band-gap reference circuit 302 may be any band-gap reference circuit that generates a reference voltage VREF 310 that is substantially stable across expected, specified, simulated, or characterized operating conditions (e.g., process, supply voltage, and temperature) of nonvolatile memory circuit 300. Band-gap circuit 302 may generate VREF 310 having a voltage that is approximately the band-gap voltage of the material used to fabricate the circuit elements constituting band-gap reference circuit 302. For example, if the circuit components (e.g., Bipolar, NMOS, PMOS, CMOS; BIC-MOS transistors, resistors, capacitors, etc.) are manufactured from a silicon-based material, then VREF may be near the band-gap voltage of silicon of 1.12 volts. For one embodiment, VREF for a silicon-based band-gap reference circuit may be approximately 1.25 volts. If the circuit components are manufactured from a different material (e.g., germanium or gallium-arsenide), then VREF may be near the band-gap voltage of that material (e.g., 0.67 volts for germanium). Band-gap circuit 302 may also be designed to generate VREF 310 having a voltage that is a multiple of, or simply greater than, the band-gap voltage of the material used to manufacture the circuit components of band-gap reference circuit 302.

If VREF 310 is less than the voltage required for VLL 314 to cause VD 316 to be in the requisite programming window (e.g., 7 to 9 volts) for nonvolatile memory cell 318, amplifier circuit 304 may amplify VREF 310 to an amplified reference voltage VAMP 312 that is within the desired voltage range for VLL 314. While any amplifying circuit may be used to amplify VREF 310 to VAMP 312, amplifying circuit 304 preferably is a non-inverting operational amplifier that generates VAMP 312 as a stable voltage that does not substantially vary with changes in operating conditions of nonvolatile memory circuit 300.

Figure 4:
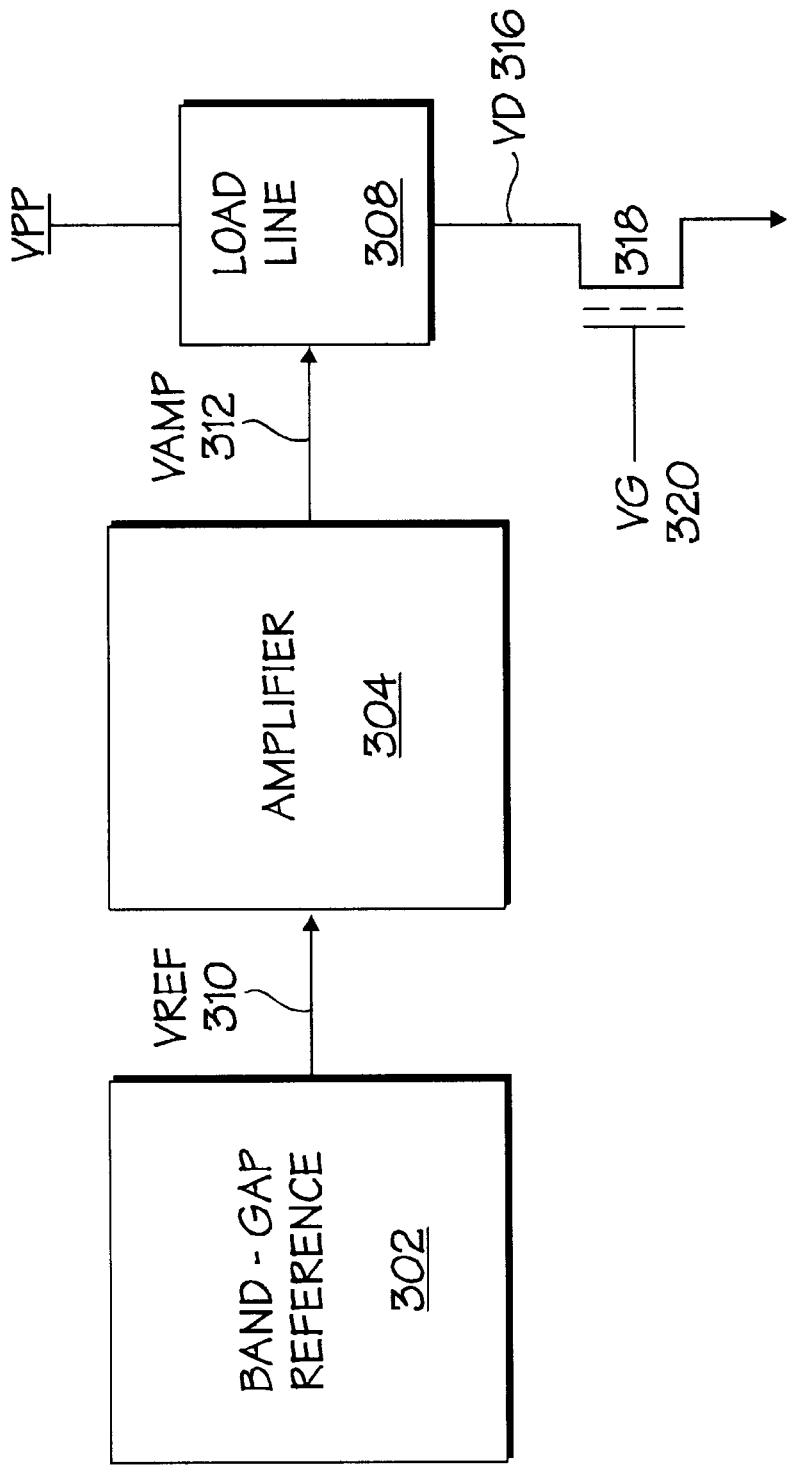
FIG. 4 is a block diagram of another embodiment of a nonvolatile memory circuit according to the present invention.

VAMP 312 may be directly connected to load line 308 as shown in FIG. 4, or may be coupled to voltage trim circuit 306 is in FIG. 3. Voltage trim circuit 306 provides a means for adjusting VAMP 312 to a desired voltage VLL 314 within a desired programming window. Voltage trim circuit 306 may be any means that generally outputs VLL 314 having a voltage that is less than or equal to VAMP 312. For example, voltage trim circuit 306 may include a resistor, a voltage divider or resistor divider network, and/or transistors. For one embodiment, the load line control voltage VLL 314 output by voltage trim circuit 306 may be programmable, and may be controlled by a control circuit (not shown), a register element (not shown), or may be externally controlled by a user or other circuitry. Preferably, voltage trim circuit 306 includes circuit elements that will output VLL 314 as a stable voltage that does not substantially vary with changes in operating conditions of nonvolatile memory circuit 300.

Figure 5:
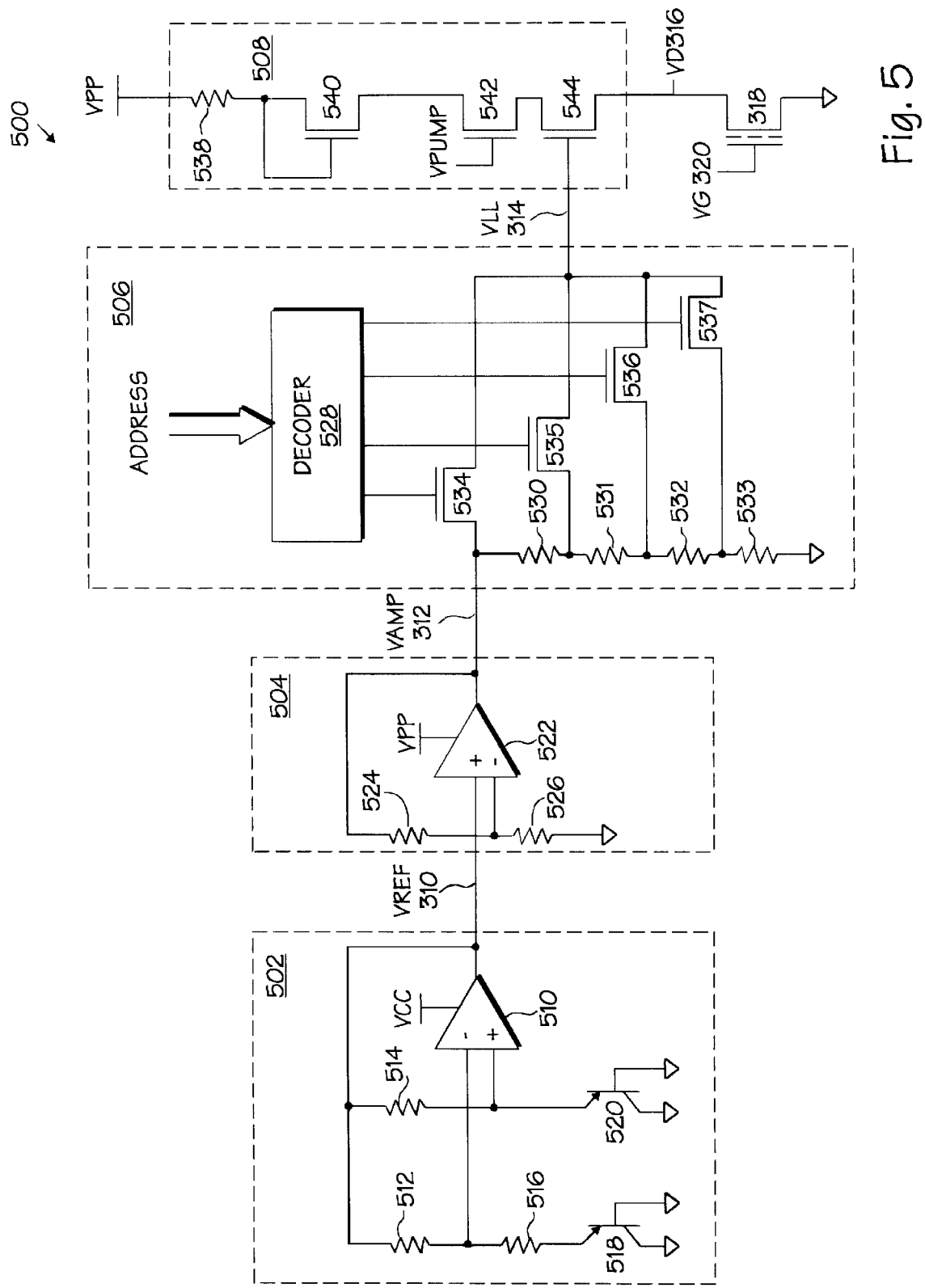
FIG. 5 is a circuit diagram of one embodiment of the nonvolatile memory circuit of FIG. 3.

FIG. 5 shows nonvolatile memory circuit 500 that is one embodiment of nonvolatile memory circuit 300 of FIG. 3. Nonvolatile memory circuit 500 includes band-gap reference circuit 502 that is one embodiment of band-gap reference circuit 302; non-inverting operational amplifier circuit 504 that is one embodiment of amplifier circuit 304; voltage trim circuit 506 that is one embodiment of voltage trim circuit 306; and, load line circuit 508 that is one embodiment of load line circuit 308 of FIG. 3. Each embodiment of circuits 502, 504, 506, and 508 of FIG. 5 may work with other embodiments of circuits 302, 304, 306, and/or 308 of FIG. 3.

Band-gap reference circuit 502 includes operational amplifier 510 having its inverted input coupled a first terminal of each of resistors 512 and 516. The second terminal of resistor 512 is coupled to the output of operational amplifier 510. The second terminal of resistor 516 is coupled to the emitter of pnp bipolar transistor 518. Transistor 518 is configured as a diode having its base and collector coupled to ground or approximately zero volts. Operational amplifier 510 has its non-inverted input coupled to a first terminal of resistor 514 and the emitter of pnp bipolar transistor 520. The second terminal of resistor 514 is coupled to resistor 512 and the output of operational amplifier 510. Transistor 520 is also configured as a diode with its base and collector coupled to ground or approximately zero volts. For an alternative embodiment, diode-configured npn bipolar transistors may replace pnp bipolar transistors 518 and 520. Operational amplifier 510 may receive power from VCC that is generally supplied to an integrated circuit or system that includes nonvolatile memory circuit 500. Alternatively, operational amplifier 510 may receive programming power supply VPP.

As generally known in the art, band-gap reference circuit 502 generates a reference voltage VREF 310 that is stable or has a variation of substantially zero as operating conditions (e.g., process parameters, operating temperatures, and supply voltage VCC) change for band-gap reference circuit 502 and nonvolatile memory circuit 500. VREF 310 may be determined according to equation one (1) below.

$$VREF_{310} = VBE_{520} + \frac{R_{512}}{R_{516}} \frac{kT}{q} \ln\left[\frac{R_{512} I_{S518}}{R_{514} I_{S520}}\right] \quad \text{(Equation 1)}$$

In equation one, $VBE_{520}$ is the base-to-emitter voltage of transistor 520 (e.g., approximately 0.5 volts to approximately 0.8 volts), $R_{512}$ is the resistance of resistor 512, $R_{514}$ is the resistance of resistors 514, $R_{516}$ is the resistance of resistor 516, $I_{S518}$ is the saturation current of pnp transistor 518, $I_{S520}$ is the saturation current of pnp transistor 520, k is Boltzman's constant and is equal to $8.62 \times 10^{-5}$ V/° K, T is the operating temperature in ° K, and q is the magnitude of electronic charge and equal to $1.6 \times 10^{-19}$ coulombs.

Equation one shows that VREF 310 comprises two terms: the first having a negative temperature coefficient ($VBE_{520}$); and, the second term having a positive temperature coefficient (kT/q). It is desirable to choose values of resistors 512, 514, 516, and saturation currents $I_{S518}$ and $I_{S520}$ that will yield a reference voltage VREF 310 that is stable across operation conditions. For silicon-based circuits, this results in VREF 310 being approximately 1.25 volts. Band-gap reference circuit 502 may be designed to output a different voltage; however, if VREF 310 is higher than approximately 1.25 volts the VREF may have a positive temperature coefficient, and if VREF 310 is lower than approximately 1.25 volts the VREF may have a negative temperature coefficient.

While any values of resistors 512, 514, and 516 may be used, for one embodiment, resistors 512 and 514 may be approximately 20 to 30 kΩ and resistor 516 may have approximately one tenth the resistance of resistors 512 and 514 (i.e., 2 to 3 kΩ) when transistor 518 is sized to have a current density one eighth of that of transistor 520.

Figure 1:
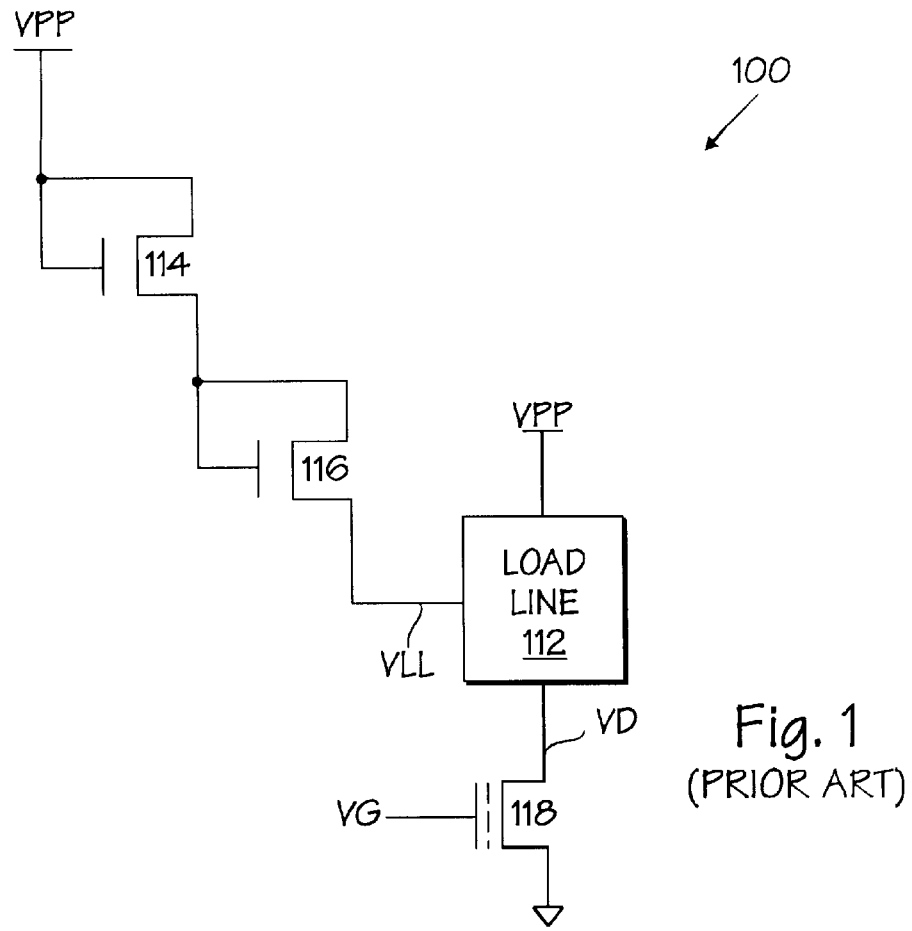
FIG. 1 is conventional nonvolatile memory circuit.
Figure 2:
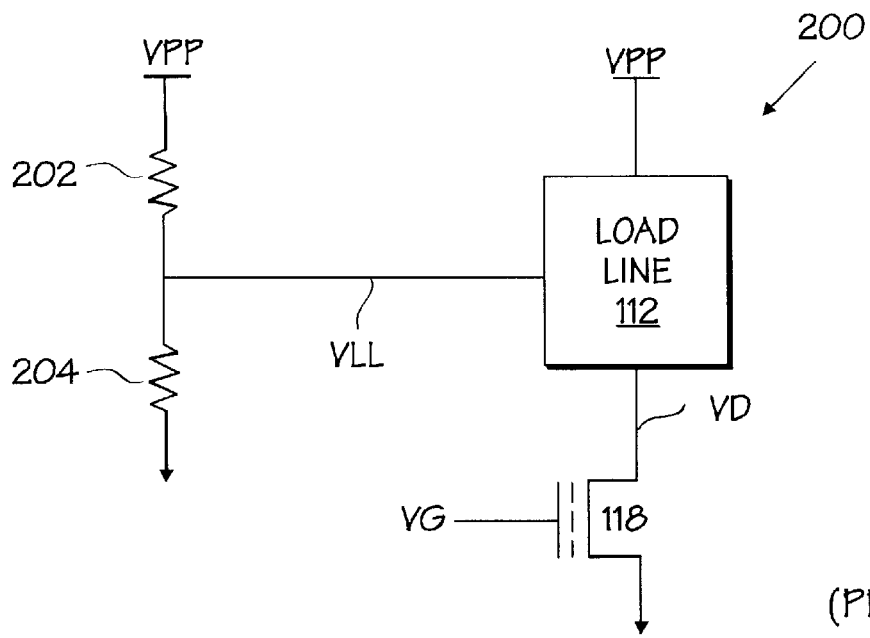
FIG. 2 is another conventional nonvolatile memory circuit.

Band-gap reference circuits such as band-gap reference circuit 502 have not previously been incorporated into a nonvolatile memory circuit to provide a stable reference voltage that may be used to generate a programming voltage for a nonvolatile memory cell. Generally, the prior art techniques of generating a load line control voltage using diode configured transistors or voltage divider schemes as in FIGS. 1 and 2 are easier to design and require considerably less silicon (or die) area to implement in an integrated circuit. Additionally, nonvolatile memory circuit processes have generally been NMOS or CMOS processes that only have parasitic bipolar transistors. Steps are normally taken to reduce the influence of the parasitic bipolar transistors on the operation of the NMOS, PMOS, or CMOS transistors in the circuit. In contrast, band-gap reference circuit 502 may advantageously make use of bipolar transistors 518 and 520 that may be present, for example, in a CMOS process. Alternatively, a BICMOS process may be used to provide both CMOS and bipolar transistors.

Amplifier 504 is a non-inverting operational amplifier that may have its non-inverted input coupled to VREF 310, and its inverted input coupled to a first terminal of each of resistors 524 and 526. A second terminal of resistor 524 is coupled to the output of operational amplifier 522. A second terminal of resistor 526 is coupled to ground or approximately zero volts. Operational amplifier 510 may receive power from programming power supply VPP.

Amplifier 504 may generate the amplified voltage VAMP 312, and may have a positive gain that may be controlled by the ratio of resistors 524 and 526 according to equation two (2).

$$VAMP_{312} = VREF_{310} \frac{(R_{524} + R_{526})}{R_{526}} \quad \text{(Equation 2)}$$

In equation two, $R_{524}$ is the resistance of resistor 524, and $R_{526}$ is the resistance of resistors 526. The resistance of resistors 524 and 526 may selected to provide any desired gain. For one embodiment, amplifier circuit 504 generates VAMP 312 having a voltage of approximately eight (8) volts, VREF 310 is approximately 1.25 volts, resistor 524 is approximately 20 kΩ, and resistor 526 is approximately 3.7 kΩ.

As shown in equation two, amplifier 504 produces VAMP 312 that is substantially independent VPP. Additionally, amplifier 504 produces VAMP 312 that is substantially independent of changes in process parameters and temperature changes. Temperature or process variations that affect the values of resistors 524 and 526 may have a similar impact on each resistor such that the gain of amplifier 504 will not substantially change with changes in operating conditions of amplifier 504 and/or nonvolatile memory circuit 500. Thus, amplifier 504 may generate an amplified reference signal provided by band-gap reference circuit 502, wherein the amplified reference voltage is generally independent of changes in operating conditions.

VAMP 312 may be coupled to an input of voltage trim circuit 506. Voltage trim circuit 506 is one embodiment of a means for adjusting or trimming the amplified voltage VAMP 312 to a desired load line control voltage VLL 314 that may less than or equal to VAMP 312. Voltage trim circuit 506 may include resistors 530, 531, 532, and 533 coupled in series between VAMP 312 and ground. Voltage trim circuit 506 may also include pass transistors 534, 535, 536, and 537 each having a source (drain) terminal coupled to one or more of resistors 530–533, a drain (source) terminal coupled together and outputting VLL 314, and a gate coupled to decoder circuit 528. Specifically, the source (drain) terminal of pass transistor 534 may be coupled to VAMP 312, the source (drain) terminal of pass transistor 535 may be coupled at the interconnection of resistors 530 and 531, the source (drain) terminal of pass transistor 536 may be coupled at the interconnection of resistors 531 and 532, and the source (drain) terminal of pass transistor 537 may be coupled at the interconnection of resistors 532 and 533. Pass transistors 534–537 may be NMOS or PMOS gates, CMOS transmission gates, or any other switch circuits.

Resistors 530–533 form a voltage divider or a resistor divider network, and may be any values that may generate a desired load line control voltage VLL 314 from VAMP 312. For one embodiment, resistors 530–533 may be approximately 10 to 20 kΩ.

Pass transistors 534–537 control which point in the voltage divider network may be tapped for VLL 314. One or more of pass transistors 534–537 may be turned on or off by decoder 528 in response to an address input. The address input may be supplied by control logic (not shown), from a register element (not shown), or from an external user or other circuitry. Alternatively, the gates of pass transistors 534–537 may be hard-wired to output a predetermined voltage to VLL 314 from the voltage divider network. For yet another embodiment, pass transistors 534–537 may be replaced with programmable elements including fuses, flash memory cells, or other programmable elements.

Voltage trim circuit 506 outputs VLL 314 that is generally independent of operating conditions because VLL 314 is dependent upon a voltage divider ratio that has a stable voltage VAMP 312 as its source. Temperature or process variations that affect the values of resistors 530–533 may have a similar impact on each resistor such that the voltage divider output of VLL 314 will not substantially change with changes in operating conditions. Additionally, decoder circuit 528 may provide pumped voltages to each gate terminal of pass transistors 534–537. The pumped voltages may be at least one threshold voltage greater than VLL 314 to reduce threshold voltage dependency of VLL 314.

Figure 6:
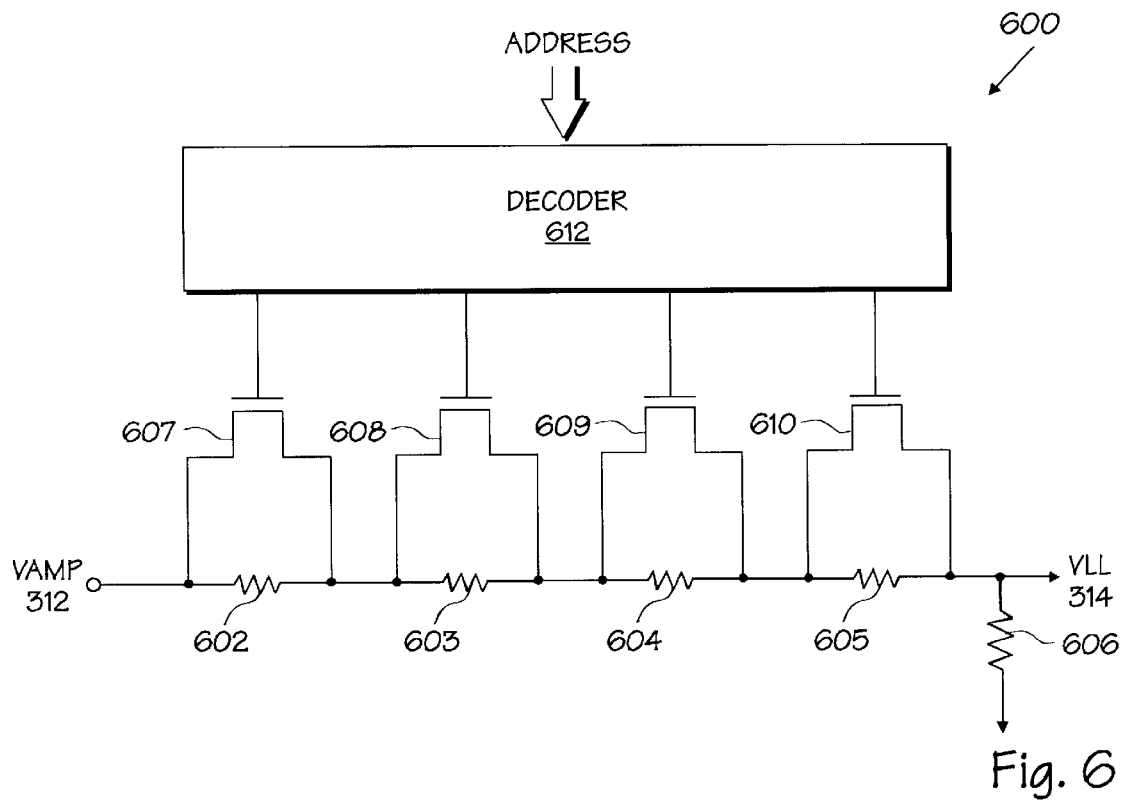
FIG. 6 is one embodiment of a voltage trim circuit.

FIG. 6 shows voltage trim circuit 600 that is another embodiment of voltage trim circuit 306 of FIG. 3 and/or voltage trim circuit 506 of FIG. 5. Voltage trim circuit 600 includes resistors 602, 603, 604, and 605 coupled in series between VAMP 312 and VLL 314. Resistors 602–606 may be coupled in a voltage divider configuration with resistor 606 that is coupled between VLL 314 and ground. Voltage trim circuit 600 may also include transistors 607, 608, 609, and 610 each having a gate coupled to decoder circuit 612, and a source and drain terminal coupled to each terminal of resistors 602, 603, 604, and 605, respectively. Transistors 607–610 may be NMOS or PMOS gates, CMOS transmission gates, or any other switch circuits.

Resistors 602–606 form a voltage divider or a resistor divider network, and may be any values that may generate a desired load line control voltage VLL 314 from VAMP 312. For one embodiment, resistors 602–606 may be approximately 10 to 20 kΩ. Transistors 607–610 control which of resistors 602–605 may participate in generating VAMP 312. One or more of transistors 607–610 may be turned on or off by decoder 612 in response to an address input. The address input may be supplied by control logic (not shown), from a register element (not shown), or from an external user or other circuitry. Alternatively, the gates of transistors 607–610 may be hard-wired to output a predetermined voltage to VLL 314 from the voltage divider network. For yet another embodiment, transistors 607–610 may be replaced with programmable elements including fuses, flash memory cells, or other programmable elements.

Voltage trim circuit 600 outputs VLL 314 that is generally independent of operating conditions because VLL 314 is dependent upon a voltage divider ratio that has a stable voltage VAMP 312 as its source. Temperature or process variations that affect the values of resistors 602–606 may have a similar impact on each resistor such that the voltage divider output of VLL 314 will not substantially change with changes in operating conditions. Additionally, decoder circuit 612 may provide pumped voltages to each gate terminal of transistors 607–610. The pumped voltages may be at least one threshold voltage greater than VLL 314 to reduce any threshold voltage dependency of VLL 314.

Figure 7:
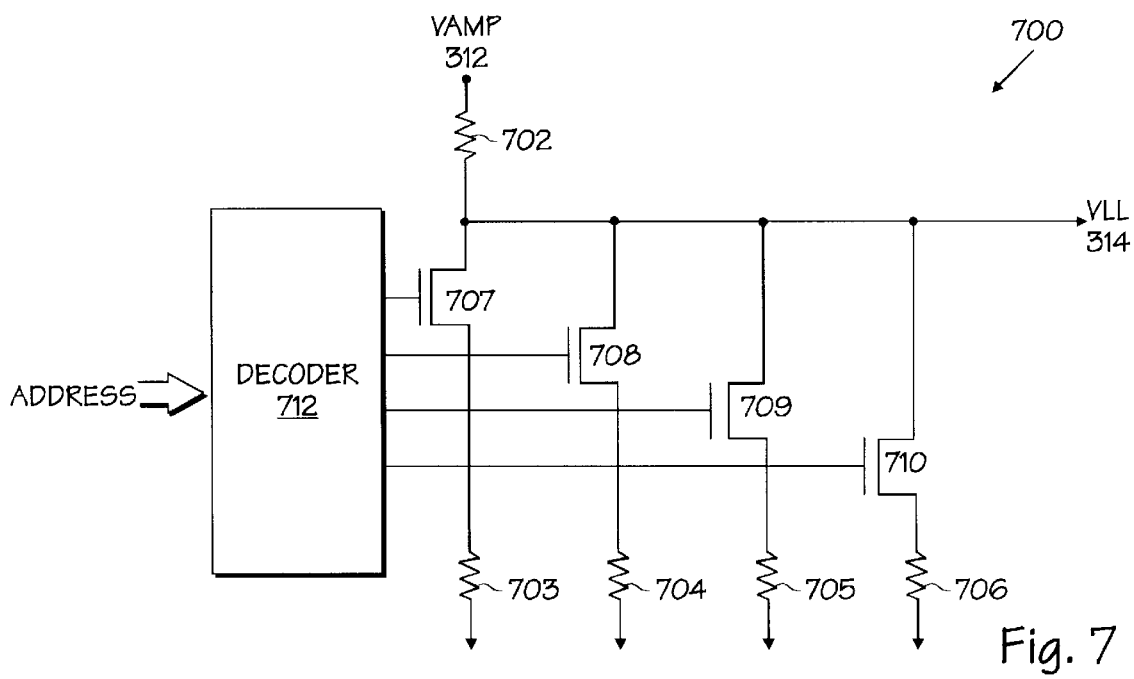
FIG. 7 is another embodiment of a voltage trim circuit.

FIG. 7 shows voltage trim circuit 700 that is another embodiment of voltage trim circuit 306 of FIG. 3 and/or voltage trim circuit 506 of FIG. 5. Voltage trim circuit 700 includes resistors 703, 704, 705, and 706 coupled in parallel with each other and coupled in a voltage divider configuration with resistor 702. Resistor 702 may be coupled between VAMP 312 and VLL 314. Resistors 703, 704, 705, and 706 may be coupled to resistor 702 via pass transistors 707, 708, 709, and 710, respectively. Transistors 707, 708, 709, and 710 may alternatively be coupled between resistors 703, 704, 705, and 706, respectively, and ground. Transistors 707–710 may each have a gate coupled to decoder circuit 712. Transistors 707–710 may be NMOS or PMOS gates, CMOS transmission gates, or any other switch circuits.

Resistors 702–706 form a voltage divider or a resistor divider network, and may be any values that may generate a desired load line control voltage VLL 314 from VAMP 312. For one embodiment, resistors 702–706 may be approximately 10 to 20 kΩ. Transistors 707–710 control which of resistors 702–706 may participate in generating VLL 314. One or more of transistors 707–710 may be turned on or off by decoder 712 in response to an address input. The address input may be supplied by control logic (not shown), from a register element (not shown), or from an external user or other circuitry. Alternatively, the gates of transistors 707–710 may be hard-wired to output a predetermined voltage to VLL 314 from the voltage divider network. For yet another embodiment, transistors 707–710 may be replaced with programmable elements including fuses, flash memory cells, or other programmable elements.

Voltage trim circuit 700 outputs VLL 314 that is generally independent of operating conditions because VLL 314 is dependent upon a voltage divider ratio that has a stable voltage VAMP 312 as its source. Temperature or process variations that affect the values of resistors 702–706 may have a similar impact on each resistor such that the voltage divider output of VLL 314 will not substantially change with changes in operating conditions. Additionally, decoder circuit 712 may provide pumped voltages to each gate terminal of transistors 707–710. The pumped voltages may be at least one threshold voltage greater than VLL 314 to reduce any threshold voltage dependency of VLL 314.

With respect to FIG. 5, nonvolatile memory circuit 500 also includes load line circuit 508. Load line circuit 508 may provide the programming voltage VD 316 (and the requisite programming current) to the drain of nonvolatile memory cell 318 during programming of the cell. Load line circuit 508 may include resistor 538 and transistors 540, 542, and 544 coupled in series with each other and coupled between programming supply voltage VPP and the drain of nonvolatile memory cell 318.

Resistor 538 may have one terminal coupled to programming supply voltage VPP, and another terminal coupled to the drain (source) of diode configured transistor 540. Transistor 540 may have its drain (source) coupled to the drain (source) of transistor 542. Transistor 542 may have its gate coupled to a pumped voltage VPUMP, and its source (drain) coupled to the drain (source) of transistor 544. The pumped voltage VPUMP may be at least one threshold voltage of transistor 542 greater than the voltage provided by transistor 540. Transistor 542 is optional and may be omitted. Transistor 544 has its source (drain) coupled to the drain of nonvolatile memory cell 318, and its gate configured to receive VLL 314.

The programming voltage VD 316 may be approximately equal to a VLL 314 minus a threshold voltage drop across transistor 544. Thus, the more stable or independent that the load line control voltage VLL 314 is with respect to variations in operating conditions of nonvolatile memory circuit 500, the more stable or independent the programming voltage VD 316 is with respect to variations in operating conditions of nonvolatile memory circuit 500.

Various other embodiments for load line circuit 508 may also be used for nonvolatile memory circuit 500, including just transistor 544, a voltage divider network, and/or any combination of a transistor and resistor circuit.

Figure 8:
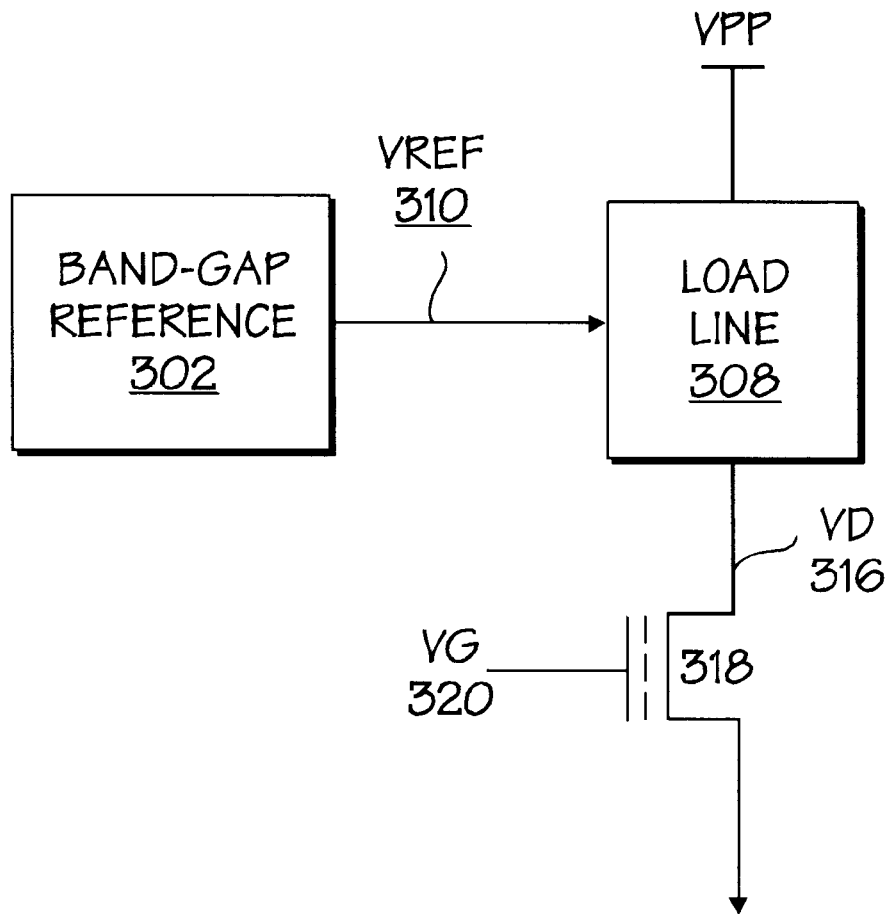
FIG. 8 is block diagram of another embodiment of a nonvolatile memory circuit according to the present invention.

With respect to FIG. 3, nonvolatile memory circuit 300 may omit voltage trim circuit 304 as illustrated in FIG. 4. Alternatively, both amplifier circuit 304 and voltage trim circuit 306 may be omitted as shown in FIG. 8. For this embodiment, band-gap reference circuit 302 may output reference voltage VREF 310 that may be sufficient to enable load line 308 to provide an adequate programming voltage VD 316 to nonvolatile memory circuit 318. For example, band-gap reference circuit 302 may generate a reference voltage VREF 310 of approximately 7 volts to approximately 10 volts.

Figure 9:
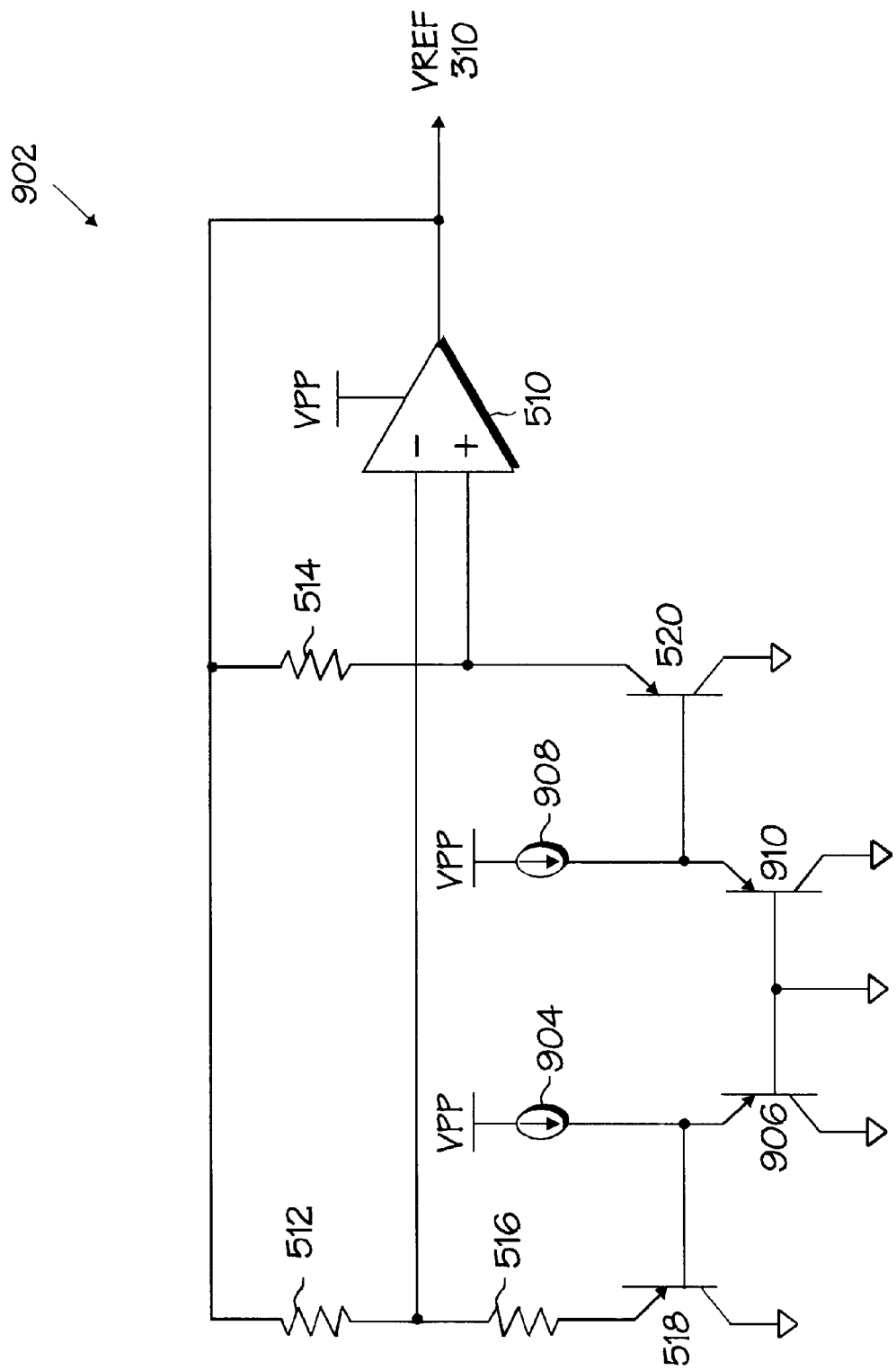
FIG. 9 is circuit diagram of one embodiment of a band-gap reference circuit.

FIG. 9 band-gap reference circuit 902 that is one embodiment of band-gap reference circuit 302 of FIG. 8 and/or FIG. 3. Band-gap reference circuit 902 has a similar configuration to band-gap reference circuit 502 of FIG. 5, except that band-gap reference circuit 902 is able to generate multiples of VREF 310 output by band-gap reference circuit 502. For each multiple increase in VREF 310, band-gap reference circuit 902 adds a bias current and pnp bipolar transistor pair to each of the non-inverted and inverted inputs of operational amplifier 510. For example, to increase the VREF from approximately 1.25 volts to approximately 2.5 volts, current source 904 and pnp transistor 906 may be coupled to the base of pnp transistor 518. Additionally, current source 908 and pnp transistor 910 may be coupled to the base of pnp transistor 520 as shown in FIG. 9. Band-gap reference circuit 902 may add additional pairs of current sources and transistors to each input of operational amplifier 510 to boost VREF 310 to any desired multiple of VREF 310 of FIG. 5 (i.e., a desired multiple of approximately 1.25 volts). For one embodiment, seven pairs of current sources and transistors may be added to each input of operational amplifier 510 to boost VREF 310 to approximately 8.75 volts.

Other embodiments of band-gap reference circuits generally known in the art may be used to provide any desired reference voltage directly to load line circuit 308.

Figure 10:
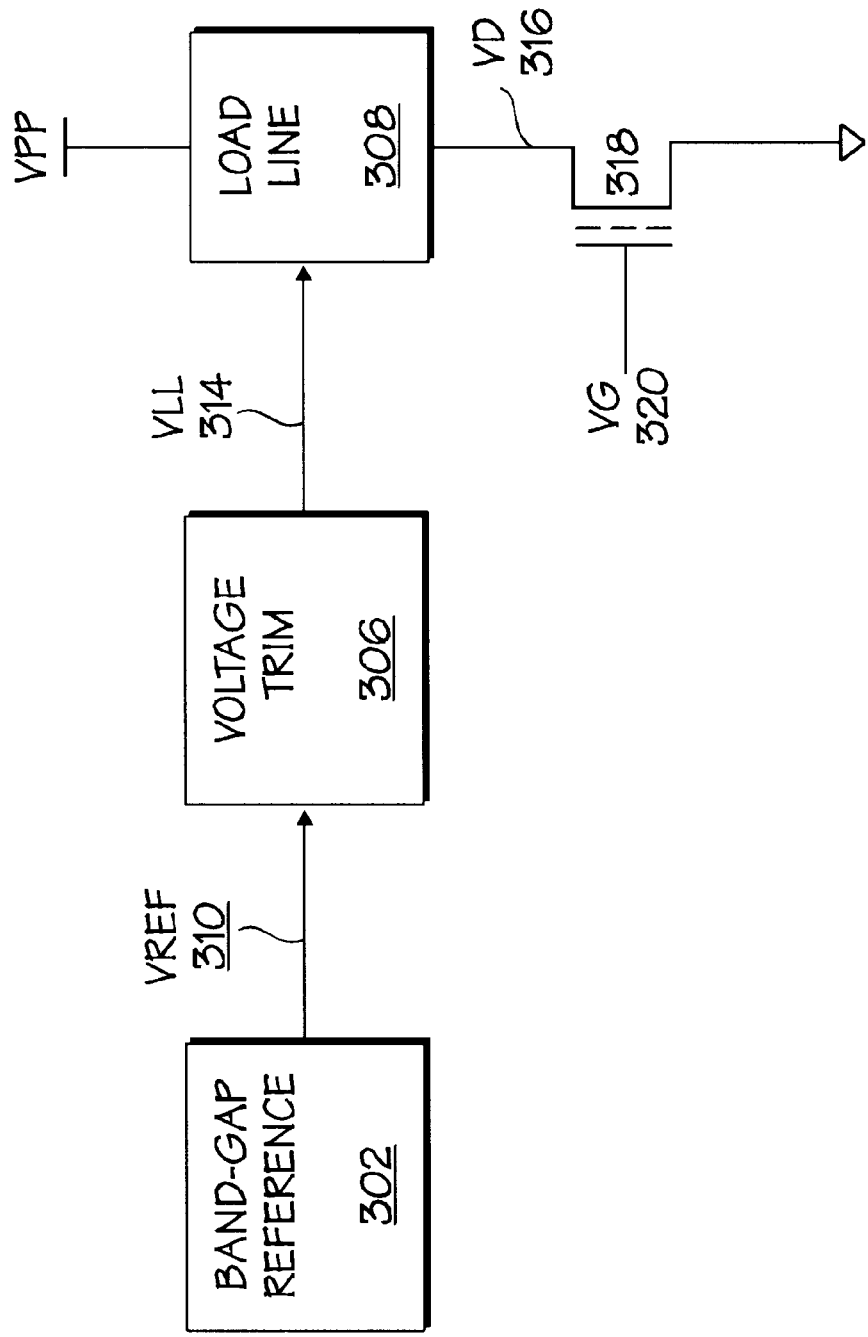
FIG. 10 is a block diagram of another embodiment of a nonvolatile memory circuit according to the present invention.

The embodiment of FIG. 8 may also include voltage trim circuit 306 coupled between band-gap reference circuit 302 and load line circuit 308 as shown in FIG. 10. Voltage trim circuit 306 may provide a means for adjusting VREF 310 output by band-gap reference circuit 302 to any desired voltage VLL 314 for load line circuit 308. FIGS. 5, 6, and 7 show exemplary embodiments of voltage trim circuit 306.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A nonvolatile memory circuit comprising:
 a band-gap reference circuit;
 a nonvolatile memory cell; and
 a load circuit coupled to the nonvolatile memory cell and having an input coupled to receive a reference voltage from the band-gap reference circuit, the load circuit to provide a programming voltage to the nonvolatile memory cell in response to the reference voltage.

2. The nonvolatile memory circuit of claim 1, wherein the reference voltage is substantially independent of operating conditions of the nonvolatile memory circuit.

3. The nonvolatile memory circuit of claim 2, wherein the operating conditions comprise fabrication process parameters, operating temperature, and operating power supply voltages of the nonvolatile memory circuit.

4. The nonvolatile memory circuit of claim 1, wherein the reference voltage output by the band-gap reference circuit is greater than 2.0 volts.

5. A nonvolatile memory circuit comprising:
 a band-gap reference circuit;
 a voltage trim circuit having an input to receive a reference voltage from the band-gap reference circuit, and an output to provide a trimmed reference voltage less than the reference voltage output by the band-gap reference circuit;
 a nonvolatile memory cell; and
 a load circuit coupled to the nonvolatile memory cell and having an input coupled to receive the trimmed reference voltage, the load circuit to provide a programming voltage to the nonvolatile memory cell in response to the trimmed reference voltage.

6. The nonvolatile memory circuit of claim 5, wherein the voltage trim circuit comprises a voltage divider circuit.

7. The nonvolatile memory circuit of claim 5, wherein the trimmed reference voltage is substantially independent from changes in operating conditions of the nonvolatile memory circuit.

8. The nonvolatile memory circuit of claim 5, wherein the voltage trim circuit comprises:

a plurality of resistors coupled in series between the input of the voltage trim circuit and a node;

a decoder; and a plurality of transistors each having a first terminal coupled to one of the plurality or resistors, a second terminal coupled to an output of the voltage trim circuit, and a third terminal coupled to the decoder.

9. The nonvolatile memory circuit of claim 5, wherein the voltage trim circuit comprises:

a plurality of resistors coupled in series between the input of the voltage trim circuit and an output of the voltage trim circuit;

a decoder; and a plurality of transistors each coupled in parallel with one of the plurality of resistors and to the decoder.

10. The nonvolatile memory circuit of claim 5, wherein the voltage trim circuit comprises:

a plurality of resistors coupled in parallel with each other and to an output of the voltage trim circuit;

a decoder; and a plurality of transistors each coupled in series between the output of the voltage trim circuit and one of the plurality of resistors.

11. The nonvolatile memory circuit of claim 5, wherein the reference voltage output by the band-gap reference circuit is greater than 2.0 volts.

12. A nonvolatile memory circuit comprising:

a band-gap reference circuit;

an operational amplifier having an input coupled to receive a reference voltage from the band-gap reference circuit, the operational amplifier to output an amplified reference voltage greater than the reference voltage;

a nonvolatile memory cell; and a load circuit coupled to the operational amplifier and the nonvolatile memory cell, the load circuit to provide a programming voltage to the nonvolatile memory cell.

13. The nonvolatile memory circuit of claim 12, wherein the operational amplifier is a non-inverting operational amplifier.

14. The nonvolatile memory circuit of claim 12, wherein the amplified reference voltage is substantially independent from changes in operating conditions of the nonvolatile memory circuit.

15. The nonvolatile memory circuit of claim 12, further comprising a voltage trim circuit coupled between the operational amplifier and the load circuit, the voltage trim circuit configured to output an adjusted amplified reference voltage less than the amplified reference voltage, wherein the load circuit provides the programming voltage to the nonvolatile memory cell in response to the adjusted amplified reference voltage.

16. The nonvolatile memory circuit of claim 15, wherein the voltage trim circuit comprises:

a plurality of resistors coupled in series between an input of the voltage trim circuit and a node;

a decoder; and a plurality of transistors each having a first terminal coupled to one of the plurality or resistors, a second terminal coupled to an output of the voltage trim circuit, and a third terminal coupled to the decoder.

17. The nonvolatile memory circuit of claim 15, wherein the voltage trim circuit comprises:

a plurality of resistors coupled in series between an input of the voltage trim circuit and an output of the voltage trim circuit;

a decoder; and a plurality of transistors each coupled in parallel with one of the plurality of resistors and to the decoder.

18. The nonvolatile memory circuit of claim 15, wherein the voltage trim circuit comprises:

a plurality of resistors coupled in parallel with each other and to an output of the voltage trim circuit;

a decoder; and a plurality of transistors each coupled in series between the output of the voltage trim circuit and one of the plurality of resistors.

19. A method of generating a programming voltage for a nonvolatile memory circuit, comprising the steps of:

generating a reference voltage that is substantially independent from changes in operating conditions of the nonvolatile memory circuit;

amplifying the reference voltage;

trimming the amplified reference voltage prior to a voltage less than the amplified reference voltage; and generating a programming voltage in response to the trimmed, amplified reference voltage.

* * * * *